United States Patent
Klostermann et al.

(10) Patent No.: US 7,902,616 B2
(45) Date of Patent: Mar. 8, 2011

(54) INTEGRATED CIRCUIT HAVING A MAGNETIC TUNNEL JUNCTION DEVICE AND METHOD

(75) Inventors: Ulrich Klostermann, Munich (DE); Franz Kreupl, Munich (DE)

(73) Assignee: Qimonda AG, Munich (DE)

( * ) Notice: Subject to any disclaimer, the term of this patent is extended or adjusted under 35 U.S.C. 154(b) by 199 days.

(21) Appl. No.: 12/164,736

(22) Filed: Jun. 30, 2008

(65) Prior Publication Data

US 2009/0321860 A1    Dec. 31, 2009

(51) Int. Cl.
*H01L 29/82* (2006.01)
(52) U.S. Cl. .............................. 257/421; 438/3
(58) Field of Classification Search ................. 257/295, 257/421, E29.323, E21.001
See application file for complete search history.

(56) References Cited

U.S. PATENT DOCUMENTS

| | | | |
|---|---|---|---|
| 6,515,897 B1 * | 2/2003 | Monsma et al. | 365/173 |
| 6,628,542 B2 | 9/2003 | Hayashi et al. | |
| 6,756,128 B2 | 6/2004 | Carey et al. | |
| 6,791,806 B1 | 9/2004 | Gao et al. | |
| 6,946,697 B2 * | 9/2005 | Pietambaram et al. | 257/295 |
| 7,226,796 B2 * | 6/2007 | Pietambaram et al. | 438/3 |
| 7,234,360 B2 | 6/2007 | Quandt et al. | |
| 7,525,774 B2 * | 4/2009 | Soda et al. | 360/324.11 |
| 7,723,128 B2 * | 5/2010 | Wang et al. | 438/3 |
| 2002/0074541 A1 * | 6/2002 | Covington | 257/9 |
| 2004/0178404 A1 * | 9/2004 | Ovshinsky | 257/4 |
| 2005/0173771 A1 | 8/2005 | Sharma | |
| 2005/0207071 A1 * | 9/2005 | Sato et al. | 360/324.2 |
| 2005/0225905 A1 | 10/2005 | Tera et al. | |
| 2006/0202692 A1 | 9/2006 | Tatschl et al. | |
| 2007/0109838 A1 * | 5/2007 | Zheng et al. | 365/158 |
| 2007/0133133 A1 * | 6/2007 | Freitag et al. | 360/324.12 |
| 2009/0141540 A1 * | 6/2009 | Miura et al. | 365/158 |

FOREIGN PATENT DOCUMENTS

EP    1052520 A1    11/2000

OTHER PUBLICATIONS

"A Perpendicular Spin Torque Switching based MRAM for the 28 nm Technology Node", U.K. Klostermann, et al., IEDM 2007.
"Adapting GMR sensors for integrated devices", K. Ludwig, et al., Sensors and Actuators A 106 (2003) 15-18.
"Angular Sensor Using Tunneling Magnetoresistive Junctions With an Artificial Antiferromagnet Reference Electrode and Improved Thermal Stability", Manfred Ruhrig, et al., IEEE Transactions on Magnetics, vol. 40, No. 1, Jan. 2004.
"Spin dependent tunneling junctions with reduced Neel coupling", Dexin Wang, et al., Journal of Applied Physics, vol. 93, No. 10, May 15, 2003.
"Thermal Select MRAM with a 2-bit Cell Capability for beyond 65 nm Technology Node", R. Leuschner, et al., IEDM 2006.

* cited by examiner

*Primary Examiner* — Thao P. Le
(74) *Attorney, Agent, or Firm* — Dicke, Billig & Czaja, PLLC

(57) ABSTRACT

An integrated circuit having a magnetic tunnel junction and method. One embodiment provides an integrated circuit having a magnetic tunnel junction is provided. The magnetic tunnel junction includes a barrier layer. The barrier layer includes carbon, pyrolytic carbon, or graphene, or graphite.

22 Claims, 4 Drawing Sheets

INTEGRATED CIRCUIT HAVING A MAGNETIC TUNNEL JUNCTION DEVICE AND METHOD

TECHNICAL FIELD

Embodiments of the invention relate generally to integrated circuits including magnetic tunnel junction devices, to a method for manufacturing an integrated circuit, and to a memory module.

BACKGROUND OF THE INVENTION

Magnetic (or magneto-resistive) random access memory (MRAM) is a non-volatile memory technology that shows considerable promise for long-term data storage. Performing read and write operations on MRAM devices is much faster than performing read and write operations on conventional memory devices such as DRAM and Flash and order of magnitude faster than long-term storage device such as hard drives.

A typical MRAM array is made up of memory cells, each of which includes a magnetic tunnel junction (MTJ) including two ferromagnetic layers separated by a non-magnetic layer (e.g., tunnel barrier layer). These magnetic layers are commonly referred to as a "fixed" or "reference" layer, in which the direction of magnetization is fixed, and a "free" layer, in which the direction of magnetization may be switched.

The resistance of an MTJ varies based on the relative directions of magnetization of these layers. For example, when the directions of magnetization of the fixed and free layers are parallel, the resistance may be relatively small (typically representing a logical "0"), and may become greater when the directions of magnetization are anti-parallel (typically representing a logical "1").

In one conventional type of MRAM, to switch the direction of magnetization of the free layer of a particular cell, currents are applied through a bit line and a word line that intersect at that cell. The combined magnitude of the currents through the word and bit lines generates a magnetic field at their intersection that is strong enough to switch the direction of magnetization of the free layer of the selected cell.

In another conventional type of MRAM, known as "spin torque" MRAM, instead of applying magnetic fields via the bit and word lines, the direction of magnetization of the free layer is switched by passing a spin-polarized current through the MTJ of the selected cell.

In order to construct high density magnetic memories, it is desirable for the cell size to be small. Because spin torque MRAM uses write currents that are typically lower than those used for generating a magnetic field sufficient for writing, smaller cell size can be achieved. This makes spin torque switching well suited for use in high density MRAM devices.

The resistance change $\Delta R = R_{AP} - R_P$, that is the difference between the anti-parallel ($R_{AP}$) and parallel ($R_P$ or R) resistance values, divided by the parallel resistance $R_P$ is known as the magnetoresistance (MR) ratio of the magnetic tunnel junction (MTJ) and is defined as $$(R_{AP} - R_P)/R_P = \Delta R/R_P = \Delta R/R.$$

For MTJ device applications it is important to have high signal-to-noise ratio (SNR), the magnitude of the SNR being directly proportional to the magnetoresistance ratio (MR ratio=$\Delta R/R$) of the magnetic tunnel junction (MTJ). The signal-to-noise ratio is given by $i_B \Delta R$, $i_B$ being the bias current passing through the MTJ device. However, the noise obtained by the MTJ device is determined, in large part, by the resistance R of the device. Thus, the maximum SNR for constant power used to sense the device can be obtained if the magnetoresistance (MR) ratio is large.

The resistance R of an MTJ device is largely determined by the resistance of the insulating tunnel barrier layer. Moreover, since the read and the write currents passes perpendicularly through the ferromagnetic layers and the tunnel layer, the resistance R of an MTJ device increases inversely with the area A of the device, therefore it is convenient to characterize the resistance of the MTJ device by the product of the resistance R times the area A (RA).

In order to scale to high memory capacities, MRAM cells will need to be shrunk in size, requiring low RA values so that the resistance R of the cell is not too high and sufficiently high heating or spin current densities can be used at acceptable values of reliability of the MTJ device.

Conventionally, the materials used for the insulating tunnel barrier layers are (Magnesium Oxide) MgO or Aluminium Oxide ($Al_2O_3$). For MgO or $Al_2O_3$ insulating tunnel barriers it has been found that RA increases exponentially with the thickness of the layer. The thickness of the MgO or $Al_2O_3$ insulating tunnel barrier layers can be varied over a sufficient range to vary RA by more than eight orders of magnitude, i.e. from more than $2 \times 10^9 \Omega(\mu m)^2$ to as little as $1 \Omega(\mu m)^2$. For typical MgO based insulating tunnel barriers a RA product of $1 \Omega(\mu m)^2$ to $10 \Omega(\mu m)^2$ is required to withstand current densities in the order of 0.1 $MA/(cm)^2$ to 10 $MA/(cm)^2$. However, for these low RA values, the magnetoresistance (MR) ratio, and therefore the SNR, is typically reduced, in part because of microscopic pin holes or other defects in the ultra thin tunnel barrier layers needed to obtain these very low RA values. Moreover, the ultra thin tunnel barrier layers needed to obtain these very low RA values reduces the barrier reliability.

Therefore there is a need in the art for MTJ devices characterized by a large tunneling magnetoresistance (MR) ratio, a reliable tunnel barrier layer and a low RA value.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DESCRIPTION

In the following Detailed Description, reference is made to the accompanying drawings, which form a part hereof, and in which is illustrated by way of illustration specific embodiments in which the invention may be practiced. In this regard, directional terminology, such as "top," "upper", "lower", "central", "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
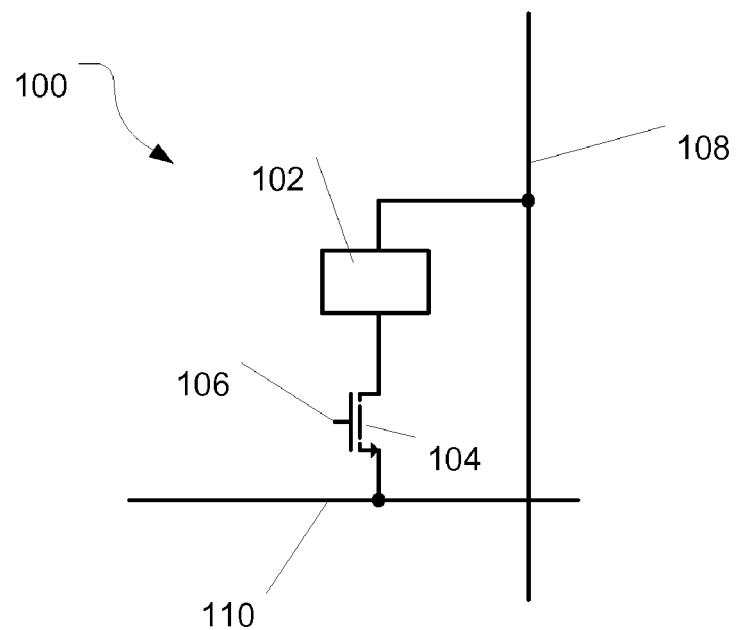
FIG. 1 illustrates one embodiment of a cell of a spin torque MRAM device.

FIG. 1 illustrates one embodiment of a cell of a spin torque MRAM device. A spin torque MRAM cell 100 includes a magnetic tunnel junction (MTJ) 102, which is connected in series with a select transistor 104 (note that as used herein the terms connected and coupled are intended to include both direct and indirect connection and coupling, respectively). A word line (not illustrated) is used to select the cell by controlling the select line 106 of the transistor 104. When writing, current is driven through the MTJ 102 through a bit line 108, which is connected to the MTJ 102 and a common line 110, which is connected to the transistor 104. The value written in the MTJ 102 is determined by the spin polarization of the critical current. When reading, the same selection mechanism is employed, a sub-critical current (which may be below about 50% of the critical current) is applied through the MTJ 102, and the bit line 108 and common line 110 are used to sense the resistance of the MTJ 102.

Figure 2:
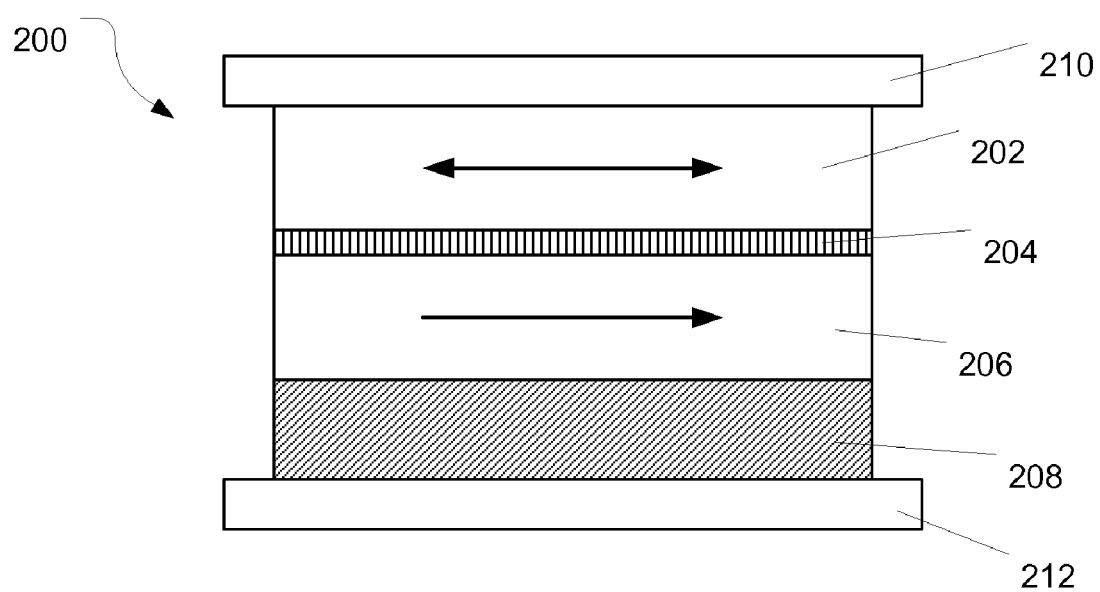
FIG. 2 illustrates the structure of a MTJ for use in a spin torque MRAM according to one embodiment.

FIG. 2 illustrates the structure of a MTJ for use in a spin torque MRAM according to one embodiment of the invention. The MTJ 200 includes a free layer (also referred to as "second ferromagnetic layer") 202, a barrier layer 204, a fixed layer (also referred to as "first ferromagnetic layer") 206 and an antiferromagnetic layer (also referred to as "first antiferromagnetic layer") 208. The fixed layer 206 and free layer 202 are typically ferromagnetic, with the fixed layer 206 having a fixed orientation of magnetization, and the free layer 202 having an orientation of magnetization that can be rotated in response to the spin polarization of a current that is driven through the MTJ 200. In an embodiment of the invention, the antiferromagnetic layer 208 is used to fix (or "pin") the orientation of magnetization of the fixed layer 206. The tunnel barrier layer 204 is configured to permit tunneling of electrons through the barrier layer 204 in the MTJ 200. Also illustrated are a top contact 210 and a bottom contact 212, which are used to drive current through the MTJ 200.

The resistance of the MTJ 200 varies according to the relative orientations of magnetization of the fixed layer 206 and the free layer 202. When the orientation of magnetization of the free layer 202 is parallel to the orientation of magnetization of the fixed layer 206, then the resistance of the MTJ 200 is low. The resistance of the MTJ 200 becomes higher when the orientation of magnetization of the free layer 202 is antiparallel to the orientation of magnetization of the fixed layer 206. These low and high resistance states can be used to represent a logical "0" or a logical "1" stored in the MTJ 200.

These layers may be composed of a variety of materials. Generally, the free layer 202 and the fixed layer 206 contain ferromagnetic metals, such as Fe, Co, Ni, Tb, Cu, Pt, or various alloys of such metals. In one embodiment, other ferromagnetic materials, such as the Heusler alloys NiMnSb, PtMnSb, $Co_2MnSi$, or oxides such as $Fe_3O_4$ or $CrO_2$ may be used. In one embodiment, the free layer 202 and the fixed layer 206 may include multilayer sheets, e.g., including a multilayer structure $[Ni/Co/Ni/Co]_n$ or $[Co/Pt/Co/Pt]_n$, wherein n is an index indicating the number of a respective multilayer structure. In one embodiment, the free layer 202 and the fixed layer 206 may include CoTbFe alloys. The fixed layer 206 may be replaced by an artificial antiferromagnet (AAF), including alternating ferromagnetic and non-magnetic layers having an exchange coupling such that in the absence of an external magnetic field, the magnetization directions of the ferromagnetic layers are antiparallel. The barrier layer 204 may include a carbon layer, in one embodiment a pyrolytic carbon layer, or in one embodiment a graphene layer, or in one embodiment graphite layer.

Figure 3:
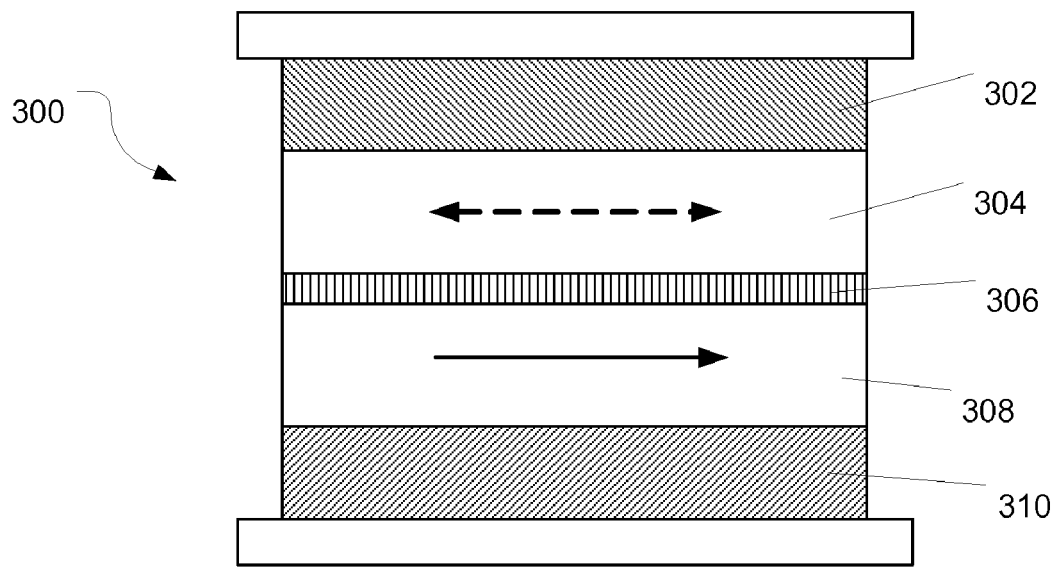
FIG. 3 illustrates an embodiment of an MTJ.

FIG. 3 illustrates an embodiment of an MTJ 300, which includes an antiferromagnetic pinning layer 302 as an embodiment of a retention layer adjacent to a free layer (also referred to as "second ferromagnetic layer") 304. The free layer 304 is separated from a fixed layer (also referred to as "first ferromagnetic layer") 308 by a barrier layer 306. The magnetization of the fixed layer 308 is pinned by an antiferromagnetic layer (also referred to as "first antiferromagnetic layer") 310. These layers may be composed of a variety of materials. Generally, the free layer 304 and the fixed layer 308 may contain ferromagnetic metals, such as Fe, Co, Ni, Tb, Cu, Pt, or various alloys of such metals. In one embodiment, other ferromagnetic materials, such as the Heusler alloys NiMnSb, PtMnSb, Co2MnSi, or oxides such as Fe3O4 or CrO2 may be used. In an embodiment of the invention, the free layer 304 and the fixed layer 308 may include multilayer sheets, e.g., including a multilayer structure $[Ni/Co/Ni/Co]_n$ or $[Co/Pt/Co/Pt]n$, wherein n is an index indicating the number of a respective multilayer structure. In another embodiment of the invention, the free layer 304 and the fixed layer 308 may include CoTbFe alloys. In some embodiments, the fixed layer 308 may be replaced by an artificial antiferromagnet (AAF), including alternating ferromagnetic and non-magnetic layers having an exchange coupling such that in the absence of an external magnetic field, the magnetization directions of the ferromagnetic layers are antiparallel. The barrier layer 306 may include a carbon layer, in one embodiment a pyrolytic carbon layer, or in one embodiment a graphene layer, or in one embodiment graphite layer. The antiferromagnetic pinning layer 302 and antiferromagnetic layer 310 may be natural antiferromagnets, including materials such as FeMn, NiMn, PtMn, IrMn, $RhMn_3$, $Ir_{20}Mn_{80}$, $Pd_{52}Pt_{18}Mn_{50}$, NiO, $\alpha$-$Fe_2O_3$, or a-$Tb_{25}Co_{75}$. In one embodiment, one or both of the antiferromagnetic pinning layer 302 and antiferromagnetic layer 310 may include an artificial antiferromagnet, composed, for example, of alternating layers of ferromagnetic and non-magnetic materials. The antiferromagnetic pinning layer 302 has a relatively low blocking temperature, and serves to pin the orientation of magnetization of the free layer 304, providing additional magnetization stability at room temperature.

When current is applied through the MTJ 300, such as when a spin polarized current is used to write a value to the MTJ 300, the current will cause heating of the MTJ 300, due to the resistance of the barrier layer. This heating may be sufficient to reach the blocking temperature of the antiferromagnetic pinning layer 302. For a natural antiferromagnet, for example, the blocking temperature will depend on the material chosen for the antiferromagnetic pinning layer 302 and the thickness of the layer. Thus, for a natural antiferromagnetic material used in the antiferromagnetic pinning layer 302, the blocking temperature can be tailored to a convenient value by adjusting the thickness of the material. For instance, if IrMn is used for the antiferromagnetic pinning layer 302, a thickness of 3 nm will provide a blocking temperature of 160° C., which is sufficiently high to ensure that the cells are pinned at room temperature or operating temperature, but low enough to be reached by the heat generated by the application of a normal spin torque write current of less than 100 mA/µm². Because the fixed layer 308 should continue to be pinned by the antiferromagnetic layer 310, the blocking temperature of the antiferromagnetic layer 310 should be set higher than the temperature that will be reached through application of a writing current. This can be achieved, for example, through the use of a natural antiferromagnetic material having a higher blocking temperature, such as PtMn, and by selecting an appropriate thickness such as, e.g., a layer thickness of about 20 nm.

Figure 4:
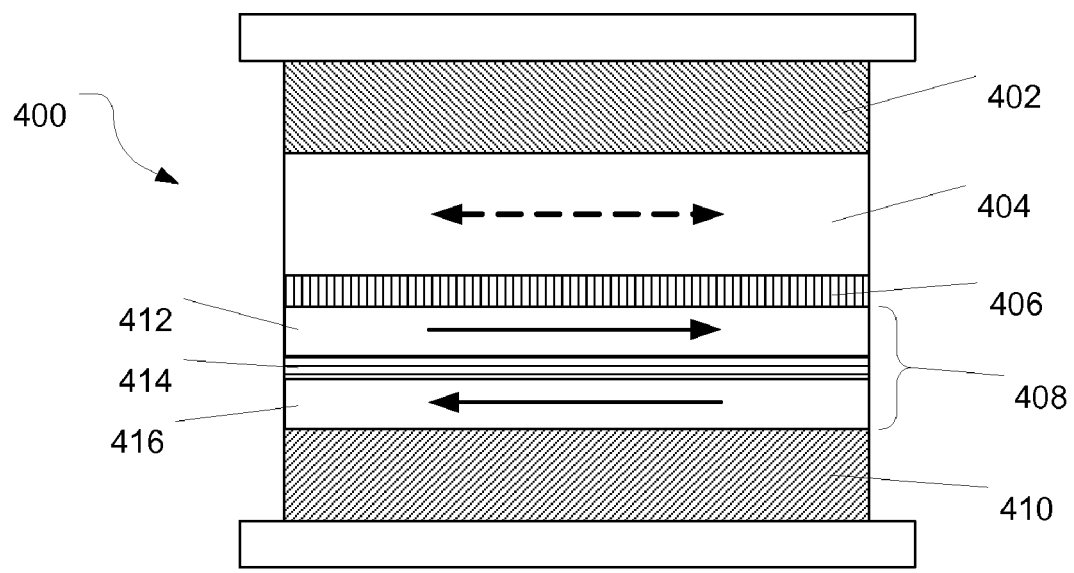
FIG. 4 illustrates an alternative embodiment of an MTJ.

FIG. 4 illustrates an alternative embodiment of an MTJ. As illustrated in FIG. 4, an MTJ 400 includes an antiferromagnetic pinning layer 402, which has a relatively low blocking temperature, suitable for pinning the magnetization orientation of a free layer (also referred to as "second ferromagnetic layer") 404 at room temperature. The free layer 404 is separated from an artificial antiferromagnetic layer 408 by a barrier layer 406. The barrier layer 406 may include a carbon layer, in one embodiment a pyrolytic carbon layer, or in one embodiment a graphene layer, or in one embodiment graphite layer. The artificial antiferromagnetic layer 408 (also referred to as synthetic antiferromagnetic layer") serves a similar purpose to a fixed layer, and is pinned by a antiferromagnetic layer (also referred to as "first antiferromagnetic layer") 410, having a relatively high blocking temperature.

The artificial antiferromagnetic layer 408 includes a fourth ferromagnetic layer 412 with a magnetization orientation that is antiparallel to a third ferromagnetic layer 416. The fourth ferromagnetic layer 412 is separated from the third ferromagnetic layer 416 by a non-magnetic layer 414, with a thickness selected to facilitate antiferromagnetic interlayer exchange between the fourth ferromagnetic layer 412 and the third ferromagnetic layer 416. In one embodiment, other designs for the artificial antiferromagnetic layer 408, including multiple ferromagnetic and non-magnetic layers may be used.

As in the embodiment described with reference to FIG. 3, the thickness and material of the antiferromagnetic pinning layer 402 may be selected to provide a blocking temperature that permits the antiferromagnetic pinning layer 402 to pin the free layer 404 at room temperature or operating temperature, but to have little or substantially no effect on the free layer 404 at a temperature that will be reached during writing of the MTJ 400.

Figure 5:
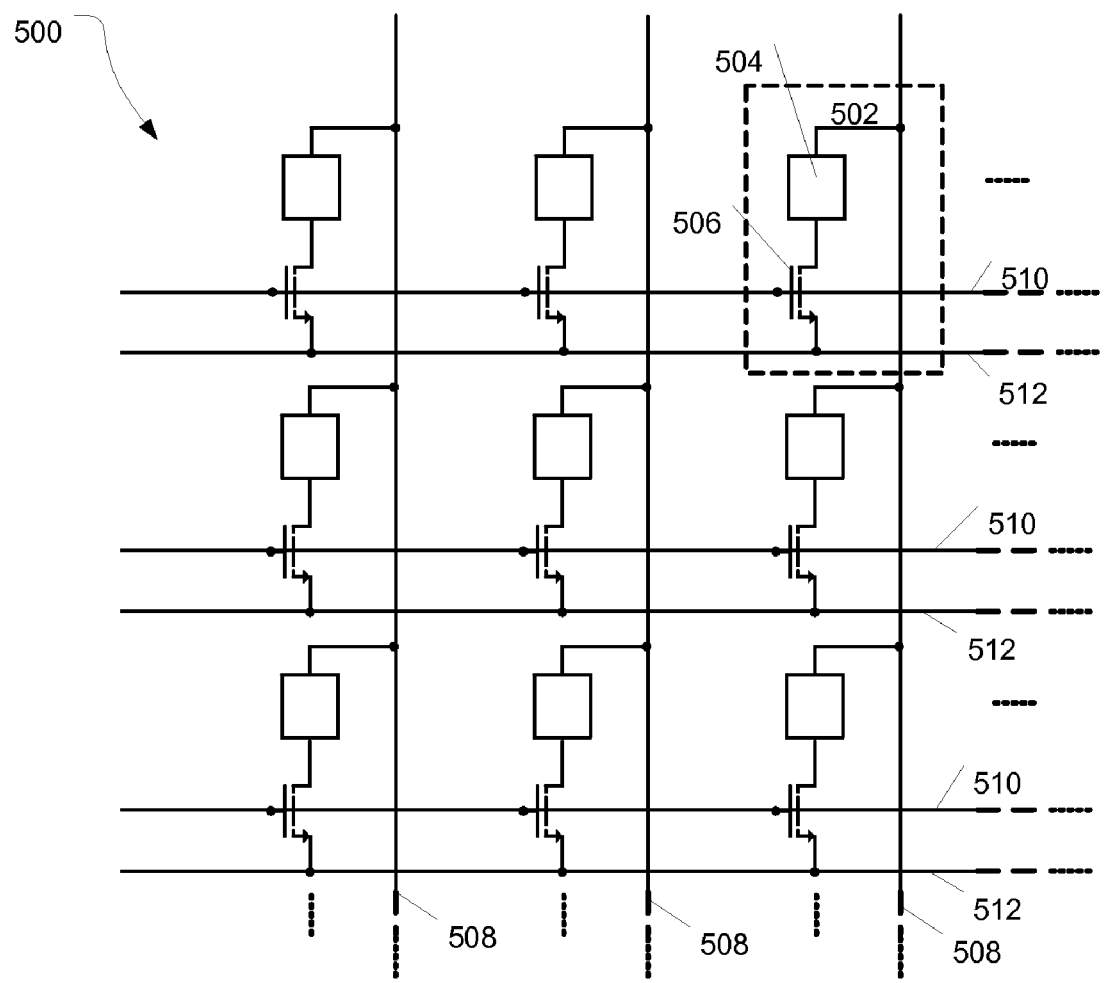
FIG. 5 illustrates a block diagram of a spin torque MRAM memory array.

FIG. 5 illustrates a block diagram of a conventional spin torque MRAM memory array. The memory array 500 includes numerous cells 502, each of which includes an MTJ 504 and a select transistor 506. Each of the cells 502 is connected to a bitline 508 and wordline 510, which select an individual cell in the array. Each of the cells 502 is also connected to a common line 512, which may be connected to ground, or to other circuitry, such as circuitry for measuring the resistance of a selected cell for the purpose of reading or writing.

In all embodiments described in FIGS. 1-5 an MTJ includes a barrier layer which may include a carbon layer, in one embodiment a pyrolytic carbon layer, or in one embodiment a graphene layer, or in one embodiment graphite layer. Using this particular material for the barrier layer makes possible to obtain very small RA values without necessarily reducing the thickness of the barrier layer. For conventional MgO or Al$_2$O$_3$ insulating tunnel barriers it has been found that RA increases exponentially with the thickness of the layer. For typical conventional MgO based MRAM insulating tunnel barriers an RA of 1Ω(µm)² to 10Ω(µm)² is required to withstand current densities in the order of 0.1 MA/(cm)² to 10 MA/(cm)². However, in conventional MgO or Al$_2$O$_3$ insulating tunnel barriers, for these low RA values the magnetoresistance (MR) ratio, and therefore the SNR, is typically reduced, in part because of microscopic pin holes or other defects in the ultra thin tunnel barrier layers needed to obtain these very low RA values. Moreover, the ultra thin tunnel barrier layers needed to obtain these very low RA values reduces the barrier reliability. On the contrary an MTJ including a carbon barrier layer, and in one embodiment a pyrolytic carbon layer, or in one embodiment a graphene layer, or in one embodiment graphite layer according to one embodiment of the invention, can have very small RA values (e.g., approximately 0.1Ω(µm)²) without reducing the thickness of the barrier layer (e.g., approximately 5 nm thickness) and can withstand high current densities (e.g., higher than 100 MA/(cm)²). As a consequence, carbon barrier layers according to one embodiment of the invention can be more easily fabricated and provide a reduction of the magnetic interaction between the free layer and the reference layer when compared with conventional MgO or Al$_2$O$_3$ insulating tunnel barriers. Moreover, the use of a carbon barrier layer, and in one embodiment a pyrolytic carbon layer, or in one embodiment a graphene layer, or in one embodiment graphite layer in magnetic tunnel junctions, according to one embodiment of the invention, results in significant improvement in the MR ratio (due to the almost total absence of spin scattering MR ratio of more than 75% can be achieved), significant improvement of the interface properties with the free layer and the fixed layer (due to the excellent interface properties of carbon and Ni magnetic systems or Graphene and Co magnetic systems), significant improvement of the thermal stability (due to the thermal stability of carbon), significant improvement in the deposition process which becomes very conformal and homogeneous, significant improvement in the etch and patterning processes due to the high etch selectivity against metals, significant reduction of swelling and damage processes due to the high corrosion resistance of the graphene. The long term stability performance of the carbon barrier may lead to less resistance drift over lifetime and can be a key-enabler for rugged environments and can reduce compensation overhead for the electronics.

In summary, in one embodiment a magnetic tunnel junction is provided that includes a barrier layer, the barrier layer including carbon, in one embodiment pyrolytic carbon, or in one embodiment graphene, or graphite. In some embodiments the barrier layer is disposed between a first ferromagnetic layer and a second ferromagnetic layer, and the barrier layer is disposed proximate to the first ferromagnetic layer. While the first ferromagnetic layer may have a fixed magnetization orientation, the second ferromagnetic layer has a magnetization orientation that may be selected by the application of a write current through the magnetic tunnel junction. This write current may include a spin polarized write current which determines the magnetization orientation of the second ferromagnetic layer. The barrier layer may be configured to heat the magnetic tunnel junction when the write current is applied to the magnetic tunnel junction. In some embodiments the magnetic tunnel junction may include a first antiferromagnetic layer disposed proximate to the first ferromagnetic layer, which may be configured to pin the orientation of the first ferromagnetic layer. The magnetic tunnel junction may also include a second antiferromagnetic layer disposed proximate to the second ferromagnetic layer, which may be configured to pin the orientation of the second ferromagnetic layer. In some embodiments the first ferromagnetic layer may include a third ferromagnetic layer disposed proximate to the first antiferromagnetic layer, this non-magnetic layer being disposed on or above the third ferromagnetic layer and a fourth ferromagnetic layer disposed proximate to the non-magnetic layer.

In another embodiment, a method is provided for manufacturing an integrated circuit having a magnetic tunnel junction, the method including forming a barrier layer, the barrier layer including carbon, in one embodiment pyrolytic carbon, or in one embodiment graphene, or graphite. In some embodiments the barrier layer is formed proximate to the first ferromagnetic layer and a second ferromagnetic layer is formed proximate to the barrier layer. In some embodiments the first ferromagnetic layer is formed proximate to a first antiferromagnetic layer and a second antiferromagnetic layer proximate to the second ferromagnetic layer. In some other embodiments forming the first ferromagnetic layer includes forming a third ferromagnetic layer disposed proximate to the first antiferromagnetic layer, forming a non-magnetic layer proximate to the third ferromagnetic layer, and forming a fourth ferromagnetic layer proximate to the non-magnetic layer.

Different methods are possible for the deposition of the barrier layer, wherein the barrier layer includes carbon, in one embodiment pyrolytic carbon, or in one embodiment graphene, or graphite.

Chemical vapor deposition (CVD) by pyrolysis of a carbon containing gas is one of these methods. Acetylene may be used at temperatures between 300°-850° C., although a typical temperature range may be 400°-500° C. At lower temperatures, a short photon flux produced by a laser or a flash lamp can be used to induce the deposition of the graphite (or pyrolytic carbon, or in one embodiment graphene).

Another possible method for the deposition of the barrier layer, wherein the barrier layer includes carbon, in one embodiment pyrolytic carbon, or in one embodiment graphene, or graphite is the combination of sputter deposition and annealing: a thin carbon layer (i.e. 1-5 nm thick) may be deposited on the magnetic stack. After deposition the carbon may be annealed at 400°-500° C. or at higher temperatures with a flash lamp or laser pulse.

Another possible method for the deposition of the barrier layer, wherein the barrier layer includes carbon, in one embodiment pyrolytic carbon, or in one embodiment graphene, or graphite is Laser Chemical vapor deposition CVD: a laser beam may be scanned over the wafer which may be immersed in a carbon containing gas. At the location of the laser beam on the wafer surface, carbon can deposit.

Another possible method for the deposition of the barrier layer, wherein the barrier layer includes carbon, in one embodiment pyrolytic carbon, or in one embodiment graphene, or graphite is the combination of spin-on coating of polymers and subsequent annealing: a positive photoresist can be spin-coated on to a wafer spinning at for example 8000 rpm on a spin coater. The spin time may be 30 s and may yield a thickness between 10-20 nm. The spin-coated wafer may be a soft-baked for example at 90° C. for 20 min. Pyrolysis may occur in a furnace with forming gas (e.g., 95% $N_2$+5% $H_2$) for approximately 20 min at room temperature. Gas flow may be continued while the temperature may be increased at the rate of, for example, 10° C./min to 400°-600° C., held at approximately 500° C. for 60 min. A flash anneal by a flash lamp or laser may be used to improve the graphite quality.

Subsequently, after deposition of the barrier layer, the second ferromagnetic layer and the top contact may be sputtered onto the carbon. An optional annealing in magnetic field may be applied to set the fixed magnetic layer properly. The second ferromagnetic layer may be patterned into the desired form. As an option, the extreme selectivity of the wet or dry etch against carbon can be used to stop on the carbon layer. A nitride or oxide (e.g., $Al_2O_3$) layer may be deposited and a spacer etch can be etched. The carbon may then be structured by a dry etch. Subsequently, the structure may be filled with oxide and planarized. Additional conventional processes may be needed to form the final memory chip.

It is important to mention that conventional thin metal oxide barriers have little process margin to provide a selective etch stop for free layer patterning, and this means that in conventional magnetic tunnel junctions a full stack etch with etching through the barrier often results in the redeposition of conductive by-products. On the contrary, magnetic tunnel junctions having a carbon barrier layer (in one embodiment pyrolytic carbon, or in one embodiment graphene, or graphite) according to different embodiments of the invention offer excellent etch selectivity due to better chemical selectivity and to the possibility of using relatively thicker barrier. Therefore spacer patterning techniques can significantly enhance processing yield, as the redeposition path across the barrier can be significantly reduced.

Figure 6:
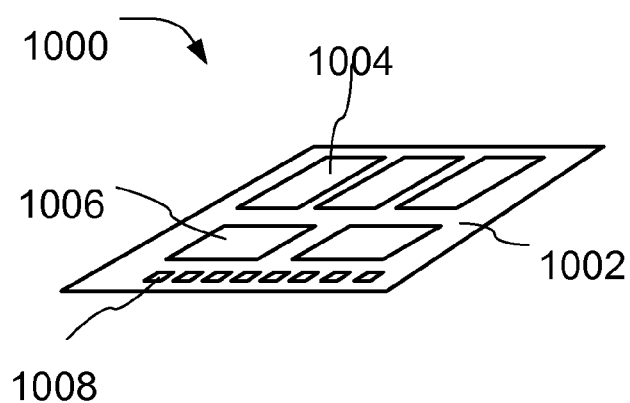
FIG. 6A illustrates one embodiment of a memory module.
FIG. 6B illustrates one embodiment of a stack of memory modules.
Figure 6:
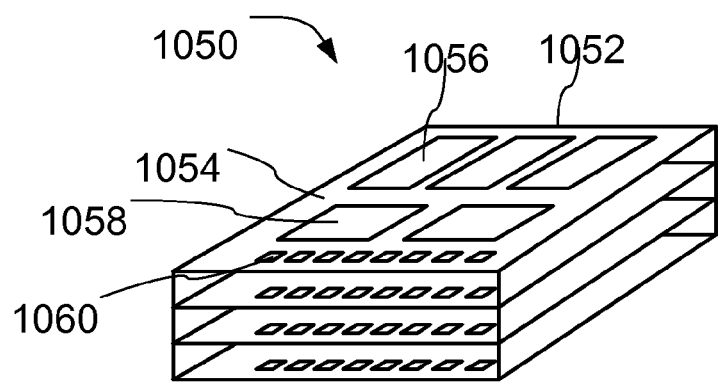

As illustrated in FIGS. 6A and 6B, in some embodiments, memory devices such as those described herein may be used in modules.

In FIG. 6A, a memory module 1000 is illustrated, on which one or more memory devices 1004 are arranged on a substrate 1002. The memory device 1004 may include numerous memory cells, each of which uses a memory element in accordance with an embodiment of the invention. The memory module 1000 may also include one or more electronic devices 1006, which may include memory, processing circuitry, control circuitry, addressing circuitry, bus interconnection circuitry, or other circuitry or electronic devices that may be combined on a module with a memory device, such as the memory device 1004. Additionally, the memory module 1000 includes multiple electrical connections 1008, which may be used to connect the memory module 1000 to other electronic components, including other modules.

As illustrated in FIG. 6B, in some embodiments, these modules may be stackable, to form a stack 1050. For example, a stackable memory module 1052 may contain one or more memory devices 1056, arranged on a stackable substrate 1054. The memory device 1056 contains memory cells that employ memory elements in accordance with an embodiment of the invention. The stackable memory module 1052 may also include one or more electronic devices 1058, which may include memory, processing circuitry, control circuitry, addressing circuitry, bus interconnection circuitry, or other circuitry or electronic devices that may be combined on a module with a memory device, such as the memory device 1056. Electrical connections 1060 are used to connect the stackable memory module 1052 with other modules in the stack 1050, or with other electronic devices. Other modules in the stack 1050 may include additional stackable memory modules, similar to the stackable memory module 1052 described above, or other types of stackable modules, such as stackable processing modules, control modules, communication modules, or other modules containing electronic components.

While the invention has been particularly illustrated and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In addition, the magnetization direction of the magnetic structures described in all embodiments of the invention can be in-plane or perpendicular to plane (even if the figures may illustrate only in-plane configurations).

What is claimed is:

1. An integrated circuit comprising:
a magnetic tunnel junction, the magnetic tunnel junction including a barrier layer, the barrier layer including carbon,
wherein the magnetic tunnel junction has a magnetoresistance ratio greater than 75%.

2. The integrated circuit of claim 1, wherein the barrier layer comprises pyrolytic carbon.

3. The integrated circuit of claim 1, wherein the barrier layer comprises graphene.

4. The integrated circuit of claim 1, wherein the barrier layer comprises graphite.

5. The integrated circuit of claim 1, wherein the barrier layer is disposed between a first ferromagnetic layer and a second ferromagnetic layer.

6. The integrated circuit of claim 5, wherein the second ferromagnetic layer comprises a magnetization orientation selected by the application of a write current through the magnetic tunnel junction.

7. The integrated circuit of claim 6, wherein the write current comprises a spin polarized write current determining the magnetization orientation of the second ferromagnetic layer.

8. The integrated circuit of claim 6, wherein the barrier layer is configured to heat the magnetic tunnel junction when the write current is applied to the magnetic tunnel junction.

9. The integrated circuit of claim 5, wherein the first ferromagnetic layer having has a fixed magnetization orientation.

10. The integrated circuit of claim 5, comprising:
a first antiferromagnetic layer disposed proximate to the first ferromagnetic layer, the first antiferromagnetic layer being configured to pin the orientation of the first ferromagnetic layer.

11. The integrated circuit of claim 5, comprising:
a second antiferromagnetic layer disposed proximate to the second ferromagnetic layer, the second antiferromagnetic layer being configured to pin the orientation of the second ferromagnetic layer.

12. The integrated circuit of claim 10, wherein the first ferromagnetic layer comprises a third ferromagnetic layer disposed proximate to the first antiferromagnetic layer, a non-magnetic layer disposed proximate to the third ferromagnetic layer and a fourth ferromagnetic layer disposed proximate to the non-magnetic layer.

13. A memory module, comprising:
a plurality of integrated circuits, wherein at least one integrated circuit includes a magnetic tunnel junction, the magnetic tunnel junction including a barrier layer, the barrier layer including carbon,
wherein the magnetic tunnel junction has a magnetoresistance ratio greater than 75%.

14. The memory module of claim 13, wherein the barrier layer comprises pyrolytic carbon.

15. The memory module of claim 13, wherein the barrier layer comprises graphene.

16. The memory module of claim 13, wherein at least some of the integrated circuits are stacked one above the other.

17. The integrated circuit of claim 1, wherein the magnetic tunnel junction has a resistance times area value of $0.1\Omega(\mu m)^2$.

18. The integrated circuit of claim 1, wherein the barrier layer has a thickness of 5 nm.

19. The integrated circuit of claim 1, wherein the magnetic tunnel junction is configured to withstand current densities greater than 100 MA/(cm)$^2$.

20. The memory module of claim 13, wherein the magnetic tunnel junction has a resistance times area value of $0.1\Omega(\mu m)^2$.

21. The memory module of claim 13, wherein the barrier layer has a thickness of 5 nm.

22. The memory module of claim 13, wherein the magnetic tunnel junction is configured to withstand current densities greater than 100 MA/(cm)$_2$.

* * * * *